(12) United States Patent
Lee et al.

(10) Patent No.: US 11,374,581 B2
(45) Date of Patent: Jun. 28, 2022

(54) LOW POWER FREQUENCY SYNTHESIZING APPARATUS

(71) Applicants: SKAIChips Co., Ltd., Suwon-si (KR); Research & Business Foundation SUNGKYUNKWAN UNIVERSITY, Suwon-si (KR)

(72) Inventors: Kang Yoon Lee, Seoul (KR); Jong Wan Jo, Suwon-si (KR); Young Gun Pu, Suwon-si (KR); Byeong Gi Jang, Suwon-si (KR); Joon Hong Park, Suwon-si (KR); Dong Soo Park, Suwon-si (KR); Jae Bin Kim, Suwon-si (KR); Yun Gwan Kim, Suwon-si (KR)

(73) Assignees: SKAIChips Co., Ltd., Suwon-si (KR); Research & Business Foundation SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 17/384,853

(22) Filed: Jul. 26, 2021

(65) Prior Publication Data
US 2022/0149787 A1     May 12, 2022

(30) Foreign Application Priority Data
Nov. 10, 2020    (KR) .................. 10-2020-0149355

(51) Int. Cl.
*H03L 7/095*    (2006.01)
*H03B 19/14*    (2006.01)
(Continued)

(52) U.S. Cl.
CPC ............ *H03L 7/095* (2013.01); *H03B 19/14* (2013.01); *H03K 21/00* (2013.01); *H03L 7/099* (2013.01);
(Continued)

(58) Field of Classification Search
CPC .................................. H03L 7/095; H03L 7/18
See application file for complete search history.

(56) References Cited

U.S. PATENT DOCUMENTS

| 9,577,575 B2 * | 2/2017 | Lee ..................... H03B 19/14 |
| 10,326,459 B1 * | 6/2019 | Lin ...................... H03L 7/181 |
| 2021/0356985 A1 | 11/2021 | Wei | |

FOREIGN PATENT DOCUMENTS

| KR | 10-1419834 B1 | 7/2014 |
| KR | 10-1563438 B1 | 10/2015 |
| KR | 10-2020-0093012 A | 8/2020 |

OTHER PUBLICATIONS

Notice of Allowance dated May 16, 2022 from the Korean Intellectual Property Office for Korean Application No. 10-2020-0149355.

* cited by examiner

*Primary Examiner* — Patrick O Neill
(74) *Attorney, Agent, or Firm* — Insight Law Group, PLLC; Seung Lee

(57) ABSTRACT

A technology related to an electronic circuit, specifically, a phase locked loop or a frequency synthesizing apparatus, is disclosed. The frequency synthesizing apparatus includes an injection locked frequency divider and a replica frequency divider having the same circuit configuration as the injection locked frequency divider. A control value required for self-oscillating at a target frequency using the replica frequency divider is determined. When the injection locked frequency divider fails injection locking on a first attempt, the injection locking may be attempted using the determined control value. On the first attempt, the control value of the injection locked frequency divider may be determined and stored in advance according to a temperature and a supply voltage.

12 Claims, 8 Drawing Sheets

(51) Int. Cl.
*H03L 7/18* (2006.01)
*H03L 7/099* (2006.01)
*H03K 21/00* (2006.01)

(52) U.S. Cl.
CPC ........ *H03L 7/18* (2013.01); *H03B 2200/0074* (2013.01)

LOW POWER FREQUENCY SYNTHESIZING APPARATUS

CROSS-REFERENCE TO RELATED APPLICATION(S)

This application claims priority from Korean Patent Application No. 10-2020-0149355, filed on Nov. 10, 2020, in the Korean Intellectual Property Office, the disclosure of which is incorporated herein by reference in its entirety.

BACKGROUND

1. Field

A technology related to an electronic circuit, specifically, a phase locked loop, is disclosed.

2. Description of Related Art

Circuits employed in analog communication semiconductors which operate in an ultra-high frequency band, for example, chips used in mobile communication systems, should satisfy requirements of reduced initial latency, low power, and a low area. Among these circuits, a phase locked loop or a frequency synthesizing apparatus includes a phase detector in a loop for accurate frequency and phase locking. The phase detector generally operates in a very low frequency range compared to an oscillation signal which is finally output. In order to drop the output oscillation signal into this low frequency range, a frequency divider which stably operates over a wide frequency range is required. Korean Patent Registration No. 1,563,438, in which one of the inventors of the present application is one of the co-inventors, proposes an injection locked frequency divider applicable to this phase locked loop or frequency synthesizing apparatus. The injection locked frequency divider which divides an injection frequency can be designed using an injection locking phenomenon which occurs in a sub-harmonic.

This injection locked frequency divider has an advantage of operating in the wide frequency range, but time is taken in a process of searching for a frequency to match a self-oscillating frequency to the injection signal, and this causes initial latency of the apparatus. Further, output of a voltage-controlled oscillator increases according to a demand of the injection signal, thereby causing an increase in power consumption.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description is directed to lowering initial latency in a frequency synthesizing apparatus which operates in an ultra-high frequency band.

Further, the following description is directed to reducing power consumption in the frequency synthesizing apparatus which operates in the ultra-high frequency band.

According to one aspect of the present disclosure, a frequency synthesizing apparatus includes an injection locked frequency divider and a replica frequency divider having the same circuit configuration as the injection locked frequency divider. A control value required for self-oscillating at a target frequency using the replica frequency divider is determined. When the injection locked frequency divider fails injection locking on a first attempt, the injection locking may be attempted using the determined control value.

According to an additional aspect, the control value required for self-oscillation of the replica frequency divider at the target frequency may be found independently of an operation of a main injection locked frequency divider.

According to an additional aspect, on the first attempt, a control value of the injection locked frequency divider may be determined according to a temperature and a supply voltage.

According to an additional aspect, as an injection locking signal is distributed to a plurality of input terminals of delay cells constituting the injection locked frequency divider, injection locking may be performed at low output of a voltage-controlled oscillator. Accordingly, a low power operation may be performed.

According to an additional aspect, after the injection locking of the injection locked frequency divider is successful, tuning of the voltage-controlled oscillator may be attempted.

Other features and aspects will be apparent from the following detailed description, the drawings, and the claims.

Figure 1:
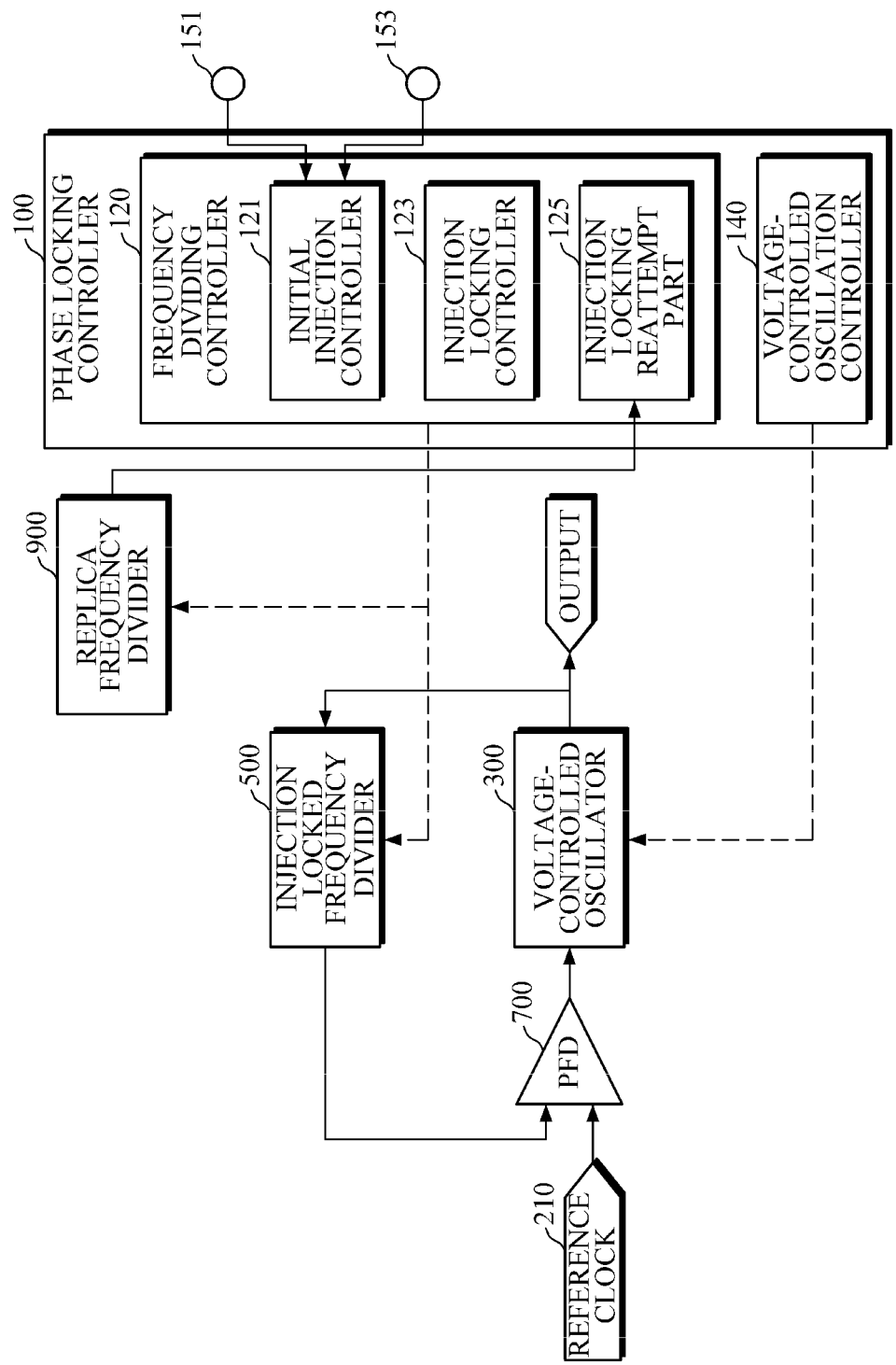
FIG. 1 is a block diagram illustrating a configuration of a frequency synthesizing apparatus according to one embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The above-described and additional aspects are specified through embodiments described with reference to the accompanying drawings. It is understood that the components of each embodiment may be variously combined within the embodiment or with components of the other embodiment without other mentions or contradiction with each other. Terms used in the specification and claims should be interpreted as means and a concept consistent with a description or proposed technical spirit based on the principle that the inventor may appropriately define the concept of terms to describe the invention thereof in the best way. Hereinafter, preferable embodiments of the present disclosure will be described in detail with reference to the accompanying drawings.

FIG. 1 is a block diagram illustrating a configuration of a frequency synthesizing apparatus according to one embodiment. As shown in the drawings, the frequency synthesizing apparatus according to one embodiment includes a voltage-controlled oscillator 300, an injection locked frequency divider 500, a replica frequency divider 900, a phase frequency detector 700, and a phase locking controller 100. The voltage-controlled oscillator 300 outputs a clock signal having a frequency proportional to an input voltage.

The injection locked frequency divider 500 determines a self-oscillating frequency according to an injection control word and outputs a signal which is injection locked and frequency-divided to a clock signal output from the voltage-controlled oscillator. In one embodiment, the injection locked frequency divider 500 is implemented as a ring-type differential injection locking oscillator. In the ring-type differential injection locking oscillator, a self-oscillating frequency may be adjusted by adjusting a delay time of each of delay cells. The delay time of the injection locked frequency divider 500 is adjusted by the injection control word. For example, it is possible to control the number of elements, for example, resistors, which adjust a delay value by switching corresponding transistors by each bit of the injection control word.

According to one aspect of the present disclosure, the frequency synthesizing apparatus includes the replica frequency divider 900 having the same circuit configuration as the injection locked frequency divider 500. The replica frequency divider 900 outputs a self-oscillating signal according to an injection control word to be input. Unlike the injection locked frequency divider 500, in which oscillation is controlled by an injection signal, since the injection signal is not supplied to the replica frequency divider 900, the self-oscillating frequency according to the injection control word is output. A control value required for self-oscillation at a target frequency using the replica frequency divider 900 is found independently of an operation of the main injection locked frequency divider 500. When the main injection locked frequency divider 500 fails injection locking on a first attempt, the injection locking may be attempted using this independently found control value.

The phase frequency detector 700 outputs a phase difference signal of a reference clock 210 to be input and an output of the injection locked frequency divider 500 to the voltage-controlled oscillator 300. The reference clock 210 may be oscillated and supplied from a stable element such as a crystal oscillator. Since the output of the voltage-controlled oscillator 300 is frequency-divided and supplied by the injection locked frequency divider 500, the reference clock 210 may be supplied at a frequency lower than the target frequency. In the illustrated embodiment, the output of the injection locked frequency divider 500 may be input to the phase frequency detector 700 through an additional divider (not shown). The output of the phase frequency detector 700 may be supplied to the voltage-controlled oscillator 300 through a stabilization circuit. In one embodiment, the stabilization circuit may include a charge pump circuit charged and discharged according to the output of the voltage-controlled oscillator 300, and a loop filter which is a low-pass filter which removes high-frequency components from the output of the charge pump circuit.

The phase locking controller 100 controls an operation of the frequency synthesizing apparatus. In the illustrated embodiment, for a high-speed operation, the phase locking controller 100 is implemented as a digital controller circuit designed with sequence logic. However, the present disclosure is not limited thereto, and the phase locking controller 100 may be implemented as a microprocessor operated by program instructions stored in a memory, or a digital logic circuit including the same.

According to one aspect, the phase locking controller 100 includes a frequency dividing controller 120. The frequency dividing controller 120 determines the injection control word when the replica frequency divider 900 outputs the self-oscillating signal having a target frequency. For example, the frequency dividing controller 120 measures a frequency by counting the self-oscillating signal output from the replica frequency divider 900 while sequentially increasing the injection control word from the minimum value. Accordingly, it is possible to determine an injection control word value when a counted value coincides with or is closest to a count value corresponding to the target frequency.

The frequency dividing controller 120 outputs the determined injection control word to the injection locked frequency divider when the injection locked frequency divider 500 fails injection locking of the target frequency. To this end, the frequency dividing controller 120 measures a frequency by counting an oscillating signal output from the injection locked frequency divider 500. When the counted value coincides with the count value corresponding to the target frequency, since the injection locking is successful, one cycle of control is terminated. When the counted value does not coincide with the count value corresponding to the target frequency, the injection locking should be attempted by inputting an injection control word of a different value to the injection locked frequency divider 500 again. According to one aspect of the present disclosure, since the independently determined injection control word is input through the replica frequency divider 900, a time required for tuning of the injection locking may be reduced and the initial latency of the apparatus may be reduced.

When the frequency dividing controller 120 counts the output signal of the injection locked frequency divider 500 or the injection locked frequency divider 500 to measure the frequency, the frequency dividing controller 120 may measure the frequency after dividing the frequency through an additional divider instead of directly counting the output signal.

Figure 3:
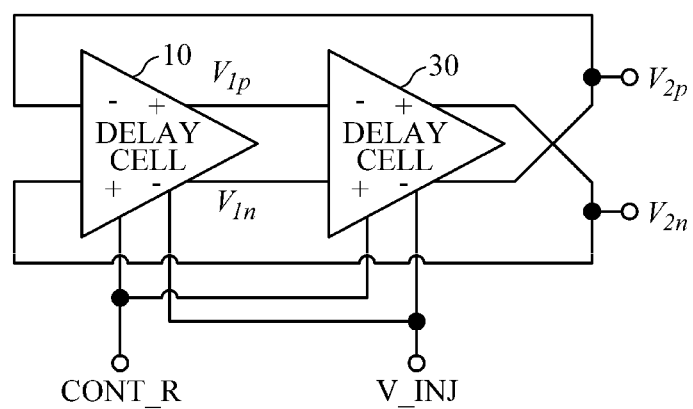
FIG. 3 is a block diagram illustrating a configuration of an injection locked frequency divider according to one embodiment.

FIG. 3 is a block diagram illustrating a configuration of the injection locked frequency divider 500 according to one embodiment. In the illustrated embodiment, the injection locked frequency divider 500 is implemented as a ring-type differential injection locking oscillator. The ring-type differential injection synchronous oscillator may have a configuration in which N delay cells 10 and 30 are alternately connected and may output a signal which is injection locked to a sub-harmonic frequency of an injection signal V_INJ, and frequency-divides the injection signal by ½N frequency. A clock signal output from the voltage-controlled oscillator 300 is applied as an injection signal to each of the N delay cells.

Figure 4:
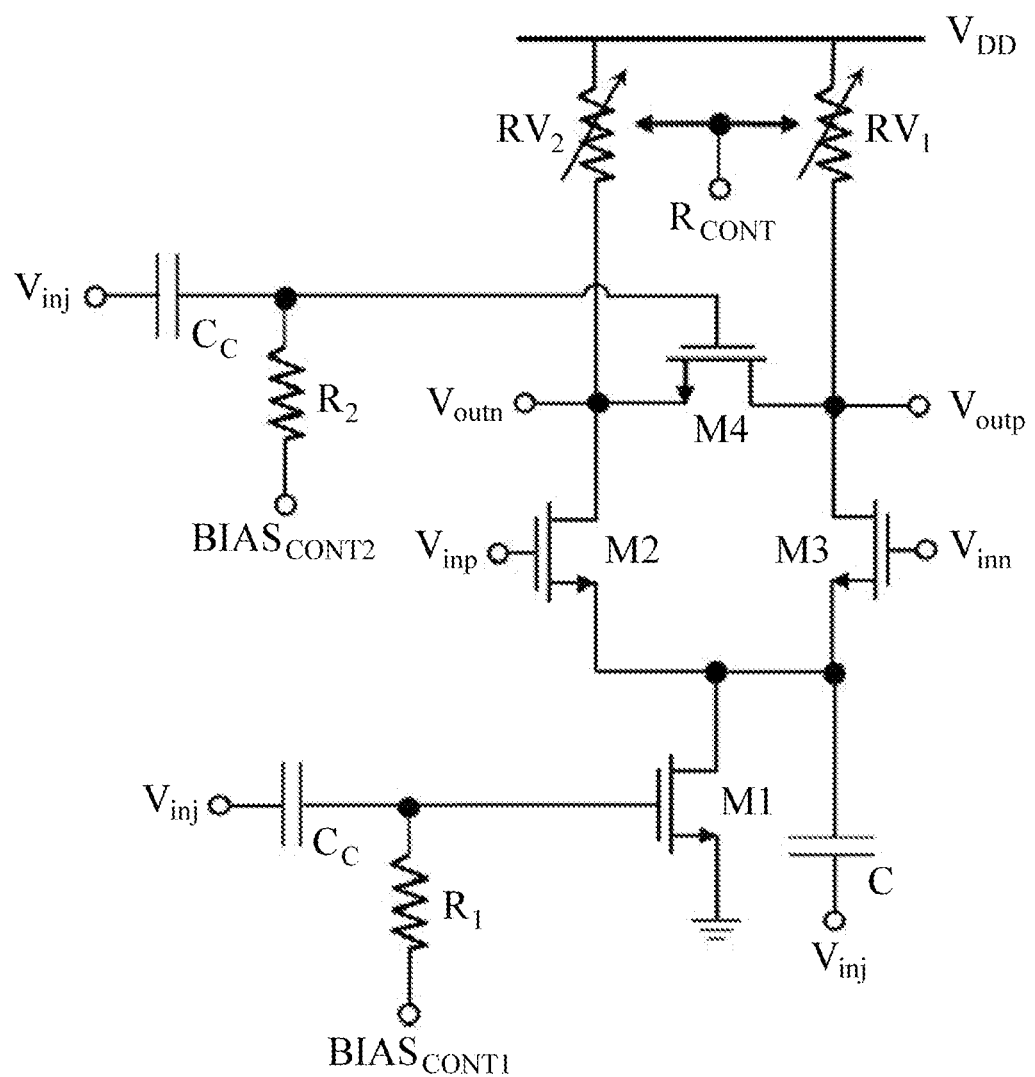
FIG. 4 is a circuit diagram illustrating one embodiment of delay cells in FIG. 3.

FIG. 4 is a circuit diagram illustrating one embodiment of the delay cells in FIG. 3. As shown in the drawings, the delay cell according to one embodiment may include a pair of differential transistors M2 and M3, a node transistor M4, a bias transistor M1, and a pair of controllable variable resistors $RV_1$ and $RV_2$. Gates of the pair of differential transistors M2 and M3 constitute input nodes $V_{inp}$ and $V_{inn}$, and output nodes of a front terminal are alternately connected. The node transistor M4 is connected across output nodes $V_{outp}$ and $V_{outn}$, which are drains of the pair of differential transistors M2 and M3.

An injection signal $V_{inj}$ is applied to a gate of the node transistor M4. Since a direct current (DC) component is removed from the injection signal through a blocking capacitor $C_c$, a bias voltage of the transistor may be controlled only by a $BIAS_{CONT2}$ signal.

The bias transistor M1 has a drain commonly connected to sources of the pair of differential transistors M2 and M3. The injection signal Vin, is applied to a gate of the bias transistor M1. Since the DC component is removed from the injection signal through the blocking capacitor $C_c$, the bias voltage of the transistor may be controlled only by the $BIAS_{CONT1}$ signal. Further, the injection signal $V_{inj}$ is also applied to the drain of the bias transistor M1. The injection signal is applied after the DC component is removed through the blocking capacitor $C_c$.

The pair of controllable variable resistors $RV_1$ and $RV_2$ have one ends respectively connected to the drains of the pair of differential transistors, and the other ends connected to a bias power supply. Resistance values of the pair of controllable variable resistors $RV_1$ and $RV_2$ are controlled by the injection control word.

Figure 5:
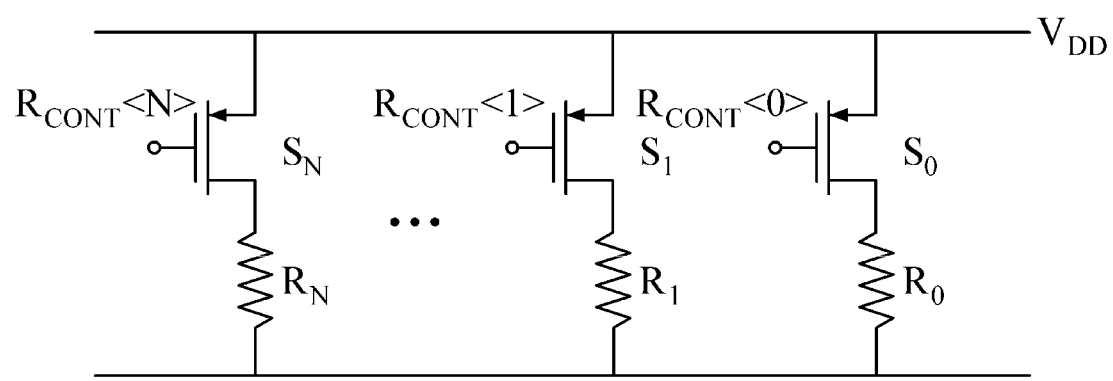
FIG. 5 is a circuit diagram illustrating one embodiment of a controllable variable resistor.

FIG. 5 is a circuit diagram illustrating one embodiment of the controllable variable resistor. The controllable variable resistor has a configuration in which N branches composed of resistors $R_0$, $R_1$, . . . , and $R_N$ and transistors $S_0$, $S_1$, . . . , and $S_N$ connected to in series to the resistors are connected in parallel, and the switching of each of the transistors $S_0$, $S_1$, . . . , and $S_N$ is controlled by each bit of an injection control word $R_{CONT}$.

According to an additional aspect, the frequency dividing controller 120 may include an initial injection controller 121. The initial injection controller 121 determines an injection control word when the injection locked frequency divider 500 outputs the self-oscillating signal having the target frequency and outputs the injection control word to the injection locked frequency divider 500. The target frequency at which the injection locked frequency divider 500 should oscillate should be a sub-harmonic of the frequency finally output by the frequency synthesizing apparatus, that is, the frequency finally output by the voltage-controlled oscillator 300. Since the circuit configuration of the injection locked frequency divider 500 is known, the initial value of this injection control word may be determined by simulation.

According to an additional aspect, the frequency dividing controller 120 may further include an injection locking controller 123. The injection locking controller 123 changes and controls the injection control word so that the injection locked frequency divider 500 is injection-locked to the target frequency. In the injection locked frequency divider, since a value of an element constituting the circuit, specifically, a capacitance value of the capacitor, changes according to fluctuations in a temperature or supply voltage, the output frequency varies even when the same injection control word is input.

In one embodiment, the injection locking controller 123 may measure the frequency of the output signal of the injection locked frequency divider 500 to repeat a process of changing a unit size in an upward direction or a downward direction based on an initial value of the injection control word input by the initial injection controller 121 until the frequency of the output signal of the injection locked frequency divider 500 reaches the target frequency. The frequency of the output signal may be measured by dividing the reference clock signal by frequency division, for example, 1/100 to generate a count active section signal, and controlling set/reset of the count thereby. Since the injection control word is a binary number, up and down control may be performed using a binary counter circuit.

According to an additional aspect, the frequency dividing controller 120 may further include an injection locking reattempt part 125. The injection locking reattempt part 125 determines the injection control word when the replica frequency divider 900 outputs the self-oscillating signal having the target frequency, and outputs the determined injection control word to the injection locked frequency divider 500 when the injection locking controller 123 fails the injection locking of the target frequency.

In one embodiment, the initial injection controller 121 determines an injection control word when the injection locked frequency divider 500 outputs the self-oscillating signal having the target frequency and outputs the determined injection control word to the injection locked frequency divider 500 and the replica frequency divider 900. The injection locking reattempt part 125 may measure the frequency of the output signal of the replica frequency divider 900 to repeat a process of changing a unit size in the upward direction or the downward direction based on an initial value of the injection control word input by the initial injection controller 121 until the frequency of the output signal of the replica frequency divider 900 reaches the target frequency. The frequency of the output signal may be measured by dividing the reference clock signal by the frequency division, for example, 1/100 to generate the count active section signal, and controlling the set/reset of the count thereby. Since the injection control word is a binary number, the up and down control may be performed using a binary counter circuit.

In another embodiment, the injection locking reattempt part 125 measures the frequency of the output signal of the replica frequency divider 900 while sequentially increasing from the minimum value of the injection control word to the maximum value to determine the injection control word of which the frequency reaches the target frequency. Since the injection control word is a binary number, the up and down control may be performed using a binary counter circuit.

Since the injection signal is not input to the replica frequency divider 900, the replica frequency divider 900 responds more quickly to the injection control word than the locking frequency divider 500. The target injection control word may be more quickly searched for in the replica frequency divider 900 than the injection locked frequency divider 500 by control of the injection locking reattempt part 125 which operates independently of the injection locking controller 123.

The injection locking reattempt part 125 outputs the determined injection control word to the injection locked frequency divider 500 when the injection locking controller 123 fails the injection locking of the target frequency. Due to the injection signal, the injection locking controller 123 may fail the injection locking of the target frequency. When the injection locking fails, the output frequency of the injection locked frequency divider 500 may be stabilized or fluctuate unstably at a frequency different from the target frequency. The injection locking reattempt part 125 may sense a failure of the injection locking of the target frequency by measuring the frequency of the output signal of injection locked frequency divider 500.

In the case in which the injection control word suitable for the target frequency is determined in the replica frequency divider 900, the injection locking reattempt part 125 may output the determined injection control word to the injection locked frequency divider 500 when the injection locking controller 123 fails the injection locking of the target frequency. Since the replica frequency divider 900 has the same circuit configuration as the injection locked frequency divider 500, the injection locked frequency divider 500 may be directly injection-locked by the determined injection control word.

Figure 2:
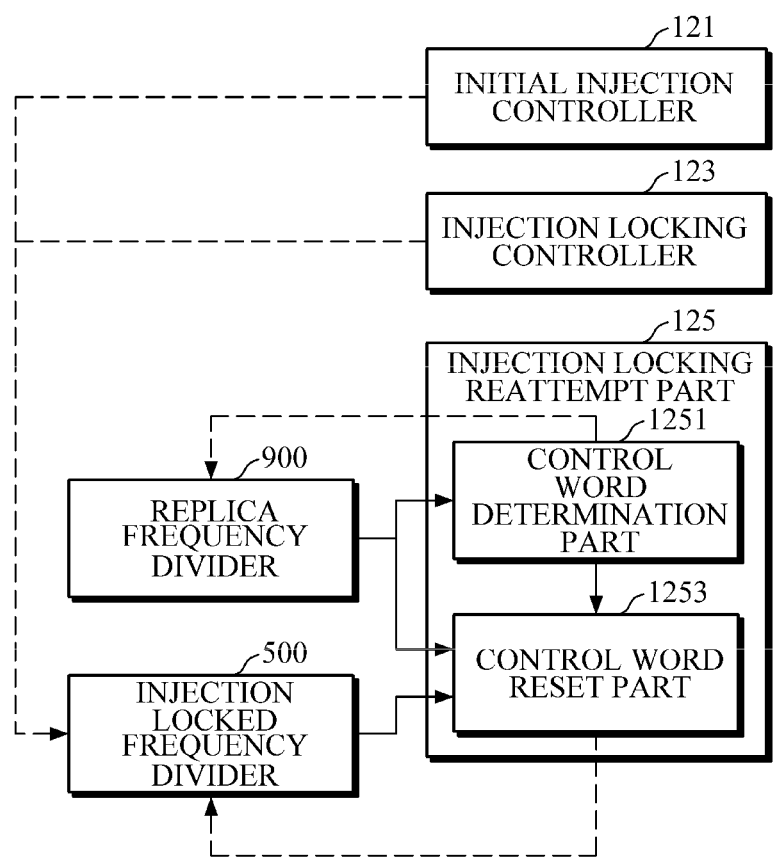
FIG. 2 is a block diagram illustrating a configuration of another embodiment of an injection locking reattempt part (125) in FIG. 1.

FIG. 2 is a block diagram illustrating a configuration of another embodiment of the injection locking reattempt part 125 in FIG. 1. The same or similar components corresponding to FIG. 1 are referred to as the same reference numerals. According to an additional aspect, the injection locking reattempt part 125 may include a control word determination part 1251 which operates independently of the injection locking controller 123. The control word determination part 1251 operates independently of the injection locking controller 123 and measures the output frequency while varying the injection control word to the replica frequency divider to search for the injection control word when the self-oscillating signal having the target frequency is output A control word reset part 1253 outputs the determined injection control word to the injection locked frequency divider 500 when the injection locking controller 123 fails the injection locking of the target frequency. The control word reset part 1253 inputs an initial injection control word value obtained by table lookup of the initial injection controller 121 to the injection locked frequency divider 500 and then is activated after a predetermined time to check whether the injection locking controller 123 fails the injection locking of the target frequency in a method similar to the above. When it is determined that the injection locking fails, the control word reset part 1253 outputs the injection control word determined in the control word determination part 1251 to the injection locked frequency divider 500.

According to an additional aspect, the frequency synthesizing apparatus may further include a temperature sensor 151 and a supply voltage detector 153. In this case, the initial injection controller 121 may determine the initial value of the injection control word from an output of the temperature sensor 151 and an output of the supply voltage detector 153. A value of a circuit element which determines the self-oscillating frequency of the injection locked frequency divider 500, and accordingly, the replica frequency divider 900 having the same circuit configuration, specifically, a capacitance value of a capacitor varies depending on a temperature. Further, the self-oscillating frequency varies according to a bias voltage of the circuit, that is, the supply voltage. The temperature sensor 151 senses a temperature around the injection locked frequency divider 500 and the replica frequency divider 900. In a chip layout, the injection locked frequency divider 500 and the replica frequency divider 900 may be disposed adjacent to each other, and the temperature sensor 151 may be disposed between the injection locked frequency divider 500 and the replica frequency divider 900. Further, the supply voltage detector 153 detects the bias voltages of two circuits. The temperature sensor 151 and the supply voltage detector 153 include a current mirror circuit to reduce an adverse effect of sensing on the circuit. The detected current values are digitally converted and supplied to the initial injection controller 121.

A value of the injection control word for oscillation of injection locked frequency divider 500 or the replica frequency divider 900 at a target frequency may be determined through a simulation or experiment according to a temperature value and a bias voltage value. In one embodiment, initial values of the injection control word determined for each of the temperature value and the bias voltage value are stored in a memory in a table format. The initial injection controller 121 may determine the initial value of the injection control word with reference to this table from the output of the temperature sensor 151 and the output of the supply voltage detector 153. Cases in which the injection locking fails due to a slight error in circuit implementation or other factors which affect the oscillating frequency even when the injection control word is input may exist. However, according to this aspect of the present disclosure, possibility of oscillation of the injection locked frequency divider 500 or the replica frequency divider 900 at the target frequency becomes much higher due to the initial value of the injection control word which is determined like the above.

Figure 6:
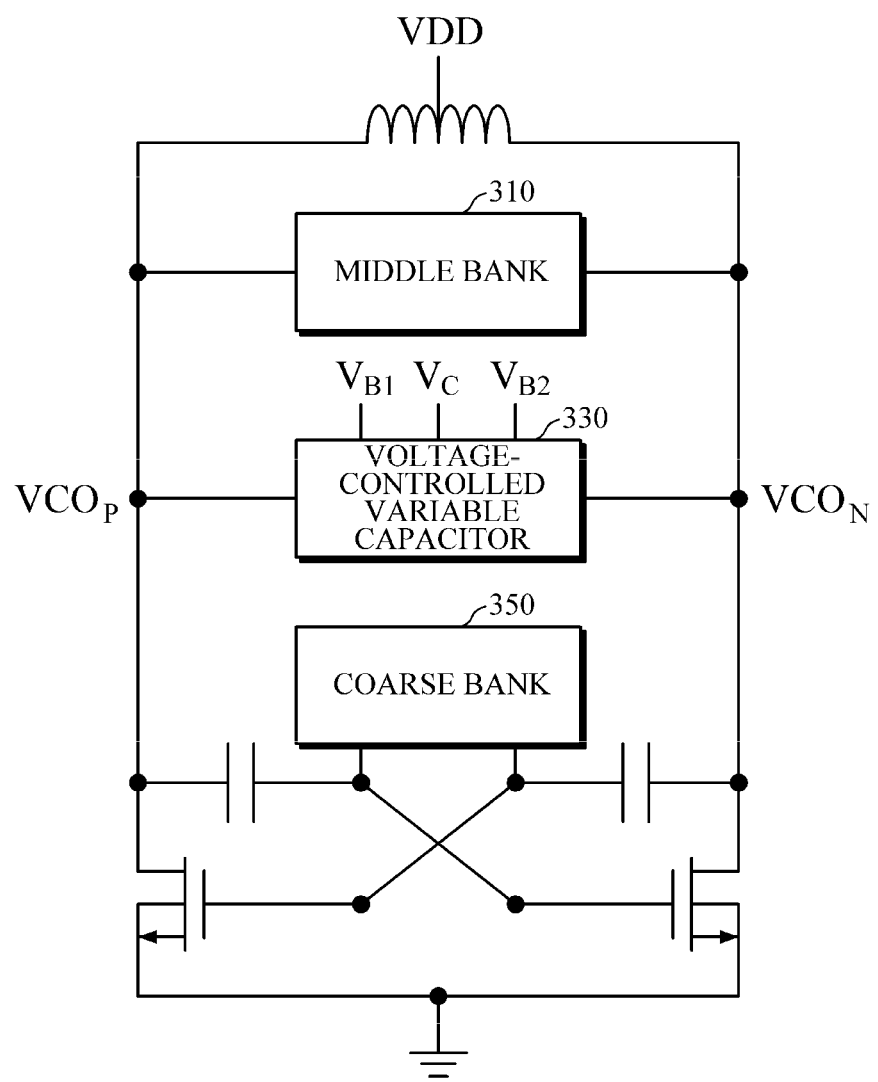
FIG. 6 illustrates a configuration of one embodiment of a voltage-controlled oscillator to which one aspect of the present disclosure may be applied.

According to an additional aspect, tuning of the voltage-controlled oscillator is attempted after the injection locking of the injection locked frequency divider is successful. FIG. 6 illustrates a configuration of one embodiment of the voltage-controlled oscillator to which one aspect of the present disclosure may be applied. In the illustrated embodiment, the voltage-controlled oscillator adopts a type of a linear transconductance voltage-controlled oscillator (LiT VCO) with low phase noise. This LiT VCO is known from, for example, a material such as that described in Bodhisatwa Sadhu et al., A linearized, low-phase-noise VCO-based 25-GHz PLL with autonomic biasing, IEEE Journal of Solid-State Circuits 48, 1138-1150. According to one aspect, the LiT VCO outputs a waveform having a frequency proportional to an input voltage $V_c$ applied to the voltage-controlled variable capacitor 330 to both ends of the voltage-controlled variable capacitor 330. In output waveforms $VCO_P$ and $VCO_N$, a phase has a difference of 180 degrees.

In the embodiment of FIG. 6, a coarse bank 350 has a configuration in which connection of capacitors is switched by a digital control word in an array in which capacitors having relatively large values are connected in parallel. The coarse bank 350 controls switching of a switch corresponding to each bit of a digital control word Crs_Cont to control the number of capacitors connected to both ends of an LC Tank circuit.

In the embodiment of FIG. 6, a middle bank 310 has a configuration in which connection of capacitors is switched by a digital control word in an array in which capacitors having relatively small values are connected in parallel. The middle bank 310 controls switching of a corresponding switch according to each bit of a digital control word Mid_Cont to control the number of capacitors connected to both ends. As the capacitor bank has a dual structure of coarse control and fine control, more precise control of the output frequency is possible.

Figure 7:
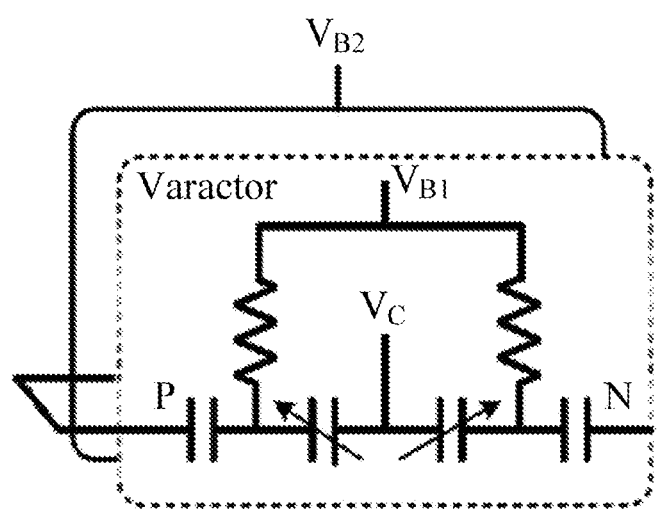
FIG. 7 illustrates a configuration of a voltage-controlled variable capacitor in the embodiment in FIG. 6.

FIG. 7 illustrates a configuration of the voltage-controlled variable capacitor (varactor) 330 in the embodiment in FIG. 6. The input voltage $V_c$ is applied to a middle node, and bias voltages $V_{B1}$ and $V_{B2}$ are applied through resistors. Since the bias voltages are controlled, a value of KVCO may be adjusted. KVCO is generally known as a proportional constant between the frequency and the input voltage in the voltage-controlled oscillator (VCO).

Referring to FIG. 1 again, the phase locking controller 100 may further include a voltage-controlled oscillation controller 140. The voltage-controlled oscillation controller 140 determines an oscillation control word, which controls the oscillation frequency, and outputs the oscillation control word to the voltage-controlled oscillator 300 after the frequency dividing controller 120 outputs the determined injection control word. The voltage-controlled oscillator 300 outputs a signal having a frequency proportional to the input voltage, but the frequency is affected by inner elements or a temperature.

As shown in FIGS. 6 and 7, the output frequency output from the same input voltage through digital oscillation control words Crs_Cont and Mid_Cont may be adjusted to be tuned to the target frequency. In one embodiment, when tuning of the injection locked frequency divider 500, that is, a target frequency-divided frequency is achieved, the voltage-controlled oscillator may be tuned by counting the frequency of the output signal of the voltage-controlled oscillator 300 while changing the oscillation control word thereafter, and checking whether the counted value is a target output frequency.

Figure 8:
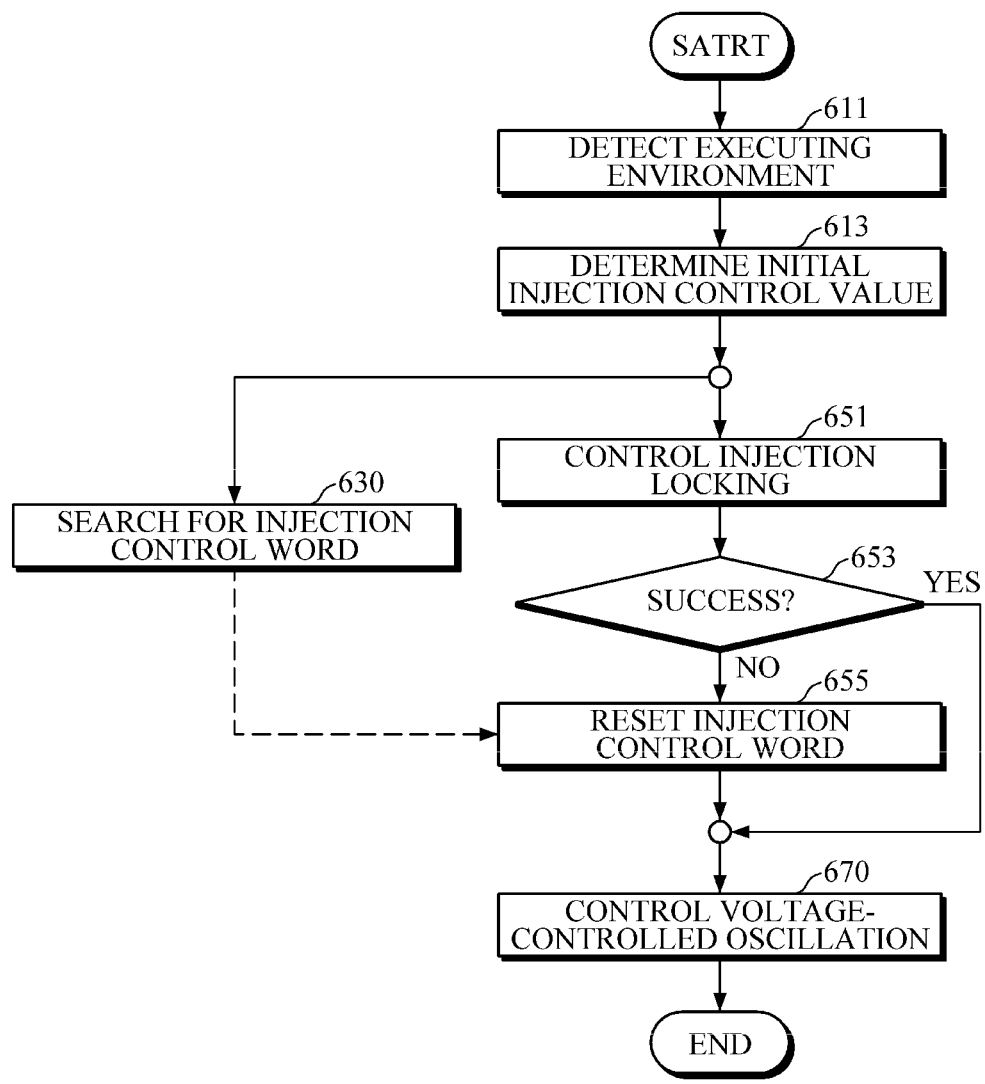
FIG. 8 is a flow chart illustrating a method of controlling a low power frequency synthesizing apparatus according to one embodiment.

FIG. 8 is a flow chart illustrating a method of controlling a low power frequency synthesizing apparatus according to one embodiment. The method of controlling a low power frequency synthesizing apparatus according to one embodiment may be applied to the low power frequency synthesizing apparatus shown in FIG. 1. However, the present disclosure is not limited thereto, and the control method may be widely applied to the frequency synthesizing apparatus which controls the self-oscillating frequency of the injection locked frequency divider with the injection control word.

As described above, the method of controlling a low power frequency synthesizing apparatus includes an operation of determining an initial injection control value (613), an operation of searching for the injection control word (630), an operation of controlling the injection locking (651), and an operation of resetting the injection locking (655). In the illustrated embodiment, the operation of searching for the injection control word (630) is executed as a separate process independent of the operation of controlling the injection locking (651). For example, these may be implemented as two independent tasks executed in one processor. As another example, these may be designed as independent hardware logic circuits.

In the operation of determining the initial injection control value (613), the frequency synthesizing apparatus determines an initial injection control value which determines the initial value of the injection control word which determines the self-oscillating frequency of the injection locked frequency divider. Since the specific method is described with reference to the initial injection controller 121 in FIG. 1, detailed descriptions will be omitted. In the operation of searching for the injection control word (630), the frequency synthesizing apparatus determines an injection control word in which a replica frequency divider having the same circuit configuration as the injection locked frequency divider oscillates at the target frequency. Since the specific method is described with reference to the injection locking reattempt part 125 in FIG. 1 and the control word determination part 1251 in FIG. 2, detailed descriptions will be omitted. In the operation of controlling the injection locking (651), the frequency synthesizing apparatus inputs an initial value of the determined injection control word to the injection locked frequency divider and attempts the injection locking. Since the specific method is described with reference to the injection locking controller 123 in FIG. 1, detailed descriptions will be omitted. In the operation of resetting the injection locking (655), when the injection locking fails in the injection locking controlling operation, the frequency synthesizing apparatus inputs the injection control word determined in the operation of searching for the injection control word (630) to the injection locked frequency divider to perform the injection locking again. Since the specific method is described with reference to the injection locking reattempt part 125 in FIG. 1 and the control word reset part 1253 in FIG. 2, detailed descriptions will be omitted.

The operation of searching for the injection control word (630) should operate under the same conditions as environmental conditions in which the operation of controlling the injection locking (651) is executed and thus may be synchronized and executed at a time in which the operation of controlling the injection locking (651) starts to be executed, or a similar time. Further, the operation of searching for the injection control word (630) should be completed before executing of the operation of controlling the injection locking (651) is completed, or at least before an operation of determining success (653).

According to an additional aspect, the operation of determining the initial injection control value (613) may determine the initial value of the injection control word according to the temperature and the supply voltage of the injection locked frequency divider circuit. To this end, the method of controlling a low power frequency synthesizing apparatus may include an operation of detecting an executing environment 611 which detects the temperature and the supply voltage before the operation of determining the initial injection control value (613).

According to an additional aspect, in the operation of searching for the injection control word (630), the injection control word outputting the self-oscillating signal having the target frequency by measuring an output frequency while varying the injection control word is determined as an injection control word to be output. Since the above is described with reference to the injection locking reattempt part 125 in FIG. 1 and the control word determination part 1251 in FIG. 2, detailed descriptions will be omitted.

According to an additional aspect, in the operation of controlling the injection locking (651), success or failure may be determined according to whether or not the oscillating signal having the target frequency is output by measuring the output frequency while varying the injection control word based on the initial value. Since the specific method is described with reference to the injection locking reattempt part 125 in FIG. 1 and the control word reset part 1253 in FIG. 2, detailed descriptions will be omitted.

According to an additional aspect, the method of controlling a low power frequency synthesizing apparatus may further include an operation of controlling voltage-controlled oscillation (670) after controlling through the operations (611 to 655) so that the injection locked frequency divider outputs the output signal having the target frequency. In the operation of controlling voltage-controlled oscillation (670), the frequency synthesizing apparatus determines the oscillation control word which controls the oscillation frequency and outputs the oscillation control word to the voltage-controlled oscillator. Since the above is described with reference to the voltage-controlled oscillation controller 140 in FIG. 1, detailed descriptions will be omitted.

According to the present disclosure, low latency and low power operation of a frequency synthesizing apparatus applied to an analog communication semiconductor which operates in an ultra-high frequency band are achieved. Further, a chip area can be reduced by changing an output load of an injection locked frequency divider from an inductor to a resistor.

In the above description, the present disclosure is described through the embodiment referring to the accompanying drawings but is not limited thereto, and the present disclosure should be interpreted to include various modified examples which may be clearly derived by those skilled in the art. The claims are intended to include these modified examples.

What is claimed is:

1. A low power frequency synthesizing apparatus comprising:
   a voltage-controlled oscillator configured to output a clock signal having a frequency proportional to an input voltage;
   an injection locked frequency divider which determines a self-oscillating frequency according to an injection control word, is injection-locked to the clock signal output from the voltage-controlled oscillator, and outputs a frequency-divided signal;
   a replica frequency divider having the same circuit configuration as the injection locked frequency divider and configured to output a self-oscillating signal according to the input injection control word;
   a phase frequency detector configured to output a phase difference signal of a reference clock to be input and an output of the injection locked frequency divider to the voltage-controlled oscillator; and
   a phase locking controller including a frequency dividing controller configured to determine the injection control word when the replica frequency divider outputs the self-oscillating signal having a target frequency, and output the determined injection control word to the injection locked frequency divider when the injection locked frequency divider fails injection locking of the target frequency.

2. The low power frequency synthesizing apparatus of claim 1, wherein the injection locked frequency divider includes a ring-type differential injection locking oscillator in which N delay cells to which the clock signal output from the voltage-controlled oscillator is applied as an injection signal are alternately connected.

3. The low power frequency synthesizing apparatus of claim 2, wherein at least one of the delay cells includes:
   a pair of differential transistors (M2 and M3) of which gates are input nodes;
   a node transistor (M4) connected across output nodes which are drains of the pair of differential transistors and in which the injection signal is applied to a gate;
   a bias transistor in which a drain is commonly connected to sources of the pair of differential transistors and the injection signal is applied to the drain and a gate; and
   a pair of variable resistors of which one ends are respectively connected to the drains of the pair of differential transistors and the other ends are connected to a bias power supply, and resistances vary according to the injection control word.

4. The low power frequency synthesizing apparatus of claim 1, wherein the frequency dividing controller includes:
   an initial injection controller configured to determine the injection control word when outputting the self-oscillating signal having the target frequency and output the injection control word to the injection locked frequency divider;
   an injection locking controller configured to change and control the injection control word so that the injection locked frequency divider is injection-locked to the target frequency; and
   an injection locking reattempt part configured to determine the injection control word when the replica frequency divider outputs the self-oscillating signal having the target frequency, and output the determined injection control word to the injection locked frequency divider when the injection locking controller fails the injection locking of the target frequency.

5. The low power frequency synthesizing apparatus of claim 4, comprising a temperature sensor and a supply voltage detector,
   wherein the initial injection controller determines an initial value of the injection control word from an output of the temperature sensor and an output of the supply voltage detector.

6. The low power frequency synthesizing apparatus of claim 4, wherein the injection locking reattempt part includes:
   a control word determination part configured to measure an output frequency while varying the injection control word to the replica frequency divider to search for the injection control word when the self-oscillating signal having the target frequency is output; and
   a control word reset part configured to output the determined injection control word to the injection locked frequency divider when the injection locking controller fails the injection locking of the target frequency.

7. The low power frequency synthesizing apparatus of claim 1, wherein the phase locking controller further includes a voltage-controlled oscillation controller configured determine an oscillation control word which controls an oscillation frequency to output the oscillation control word to the voltage-controlled oscillator after the frequency dividing controller outputs the determined injection control word.

8. A method of controlling a low power frequency synthesizing apparatus, the method comprising:
   an initial injection control value determining operation of determining an initial value of an injection control word which determines a self-oscillating frequency of an injection locked frequency divider;
   an injection control word searching operation of determining the injection control word, in which a replica frequency divider having the same circuit configuration as the injection locked frequency divider oscillates at a target frequency;
   an injection locking controlling operation of inputting the determined initial value of the injection control word to the injection locked frequency divider to attempt injection locking; and
   an injection locking resetting operation of inputting the injection control word determined in the injection control word searching operation to the injection locked frequency divider to perform the injection locking again when the injection locking fails in the injection locking controlling operation.

9. The method of claim 8, wherein in the initial injection control value determining operation, the initial value of the injection control word is determined according to a temperature and a supply voltage of the injection locked frequency divider circuit.

10. The method of claim 8, wherein in the injection control word searching operation, the injection control word when outputting a self-oscillating signal having the target frequency by measuring an output frequency while varying the injection control word is determined as an injection control word to be output.

11. The method of claim 8, wherein in the injection locking controlling operation, success or failure is determined according to whether or not an oscillating signal having the target frequency is output by measuring an output frequency while varying the injection control word based on the initial value.

12. The method of claim 8, further comprising a voltage-controlled oscillation controlling operation of determining an oscillation control word which controls an oscillation frequency and outputting the oscillation control word to a voltage-controlled oscillator after controlling so that the injection locked frequency divider outputs an output signal having the target frequency.

\* \* \* \* \*